United States Patent
Seino et al.

(10) Patent No.: US 7,456,687 B2
(45) Date of Patent: Nov. 25, 2008

(54) AMPLIFIER UNIT AND METHOD OF DETECTING FAILURE IN THE SAME

(75) Inventors: Akira Seino, Kawasaki (JP); Hiroaki Maeda, Kawasaki (JP); Takashi Ono, Kawasaki (JP); Yousuke Okazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 59 days.

(21) Appl. No.: 11/790,982

(22) Filed: Apr. 30, 2007

(65) Prior Publication Data

US 2007/0285158 A1    Dec. 13, 2007

(30) Foreign Application Priority Data

May 2, 2006   (JP)   ............... 2006-128271

(51) Int. Cl.
*H03F 3/68* (2006.01)
(52) U.S. Cl. .................... 330/124 R; 330/295
(58) Field of Classification Search ............... 33/124 R, 33/295, 84, 126
See application file for complete search history.

(56) References Cited

U.S. PATENT DOCUMENTS

| | | | |
|---|---|---|---|
| 5,739,723 A | 4/1998 | Sigmon et al. | |
| 5,757,229 A * | 5/1998 | Mitzlaff | 330/124 R |
| 5,886,575 A * | 3/1999 | Long | 330/129 |
| 6,617,929 B2 * | 9/2003 | Kim et al. | 330/295 |
| 6,853,245 B2 | 2/2005 | Kim et al. | |
| 6,917,246 B2 | 7/2005 | Thompson | |
| 7,061,314 B2 * | 6/2006 | Kwon et al. | 330/124 R |
| 7,268,617 B2 * | 9/2007 | Kijima | 330/124 R |
| 7,345,535 B2 * | 3/2008 | Kwon et al. | 330/124 R |

FOREIGN PATENT DOCUMENTS

| | | |
|---|---|---|
| JP | 9-181533 | 7/1997 |
| JP | 2006-060301 | 3/2006 |

OTHER PUBLICATIONS

Extended European search report; Application No. 07107120.3-2215; Reference No. P108408P00/DNL; dated Oct. 9, 2007; 4 pages.

* cited by examiner

*Primary Examiner*—Henry K Choe
(74) *Attorney, Agent, or Firm*—Hanify & King, P.C.

(57) ABSTRACT

The present invention provides an amplifier unit including a carrier amplifier biased for Class A or Class AB operation; a peak amplifier biased for Class B or Class C operation, wherein an input signal is input to the carrier amplifier and the peak amplifier, and wherein output signals from the carrier amplifier and the peak amplifier are synthesized to output therefrom; a comparator configured to compare a gate bias voltage of a transistor device in the peak amplifier with a predetermined threshold voltage and output a first output signal; and a failure detection circuit configured to output a second output signal indicating presence or absence of failure, based on the first output signal received from the comparator.

4 Claims, 6 Drawing Sheets

AMPLIFIER UNIT AND METHOD OF DETECTING FAILURE IN THE SAME

BACKGROUND OF THE INVENTION

1. Field of the Invention

The present invention relates to an amplifier unit and a method of detecting failure in the same, specifically to a Doherty type amplifier unit having a carrier amplifier and a peak amplifier, and a method of detecting failure in such an amplifier unit.

2. Description of the Related Art

A Doherty type amplifier unit has drawn much attention as an amplifier suitable for power amplification in a base station of a mobile communications system due to its capability of operating efficiently. Such an amplifier is composed of a carrier amplifier and a peak amplifier. The carrier amplifier is typically biased for class A or AB operation. Thus, the carrier amplifier receives an input signal and amplifies the received signal to output the amplified signal even when the input signal is low.

The peak amplifier is biased for Class B or C operation. Thus, the peak amplifier does not amplify nor output any signal when electric power of an instantaneous input signal is not high enough to turn on the peak amplifier. In addition, the peak amplifier consumes no or negligibly low direct current power, which contributes to highly efficient operation of the Doherty amplifier as a whole.

When an instantaneous input signal to the peak amplifier is higher, the peak amplifier turns on and amplifies the input signal to output the amplified signal. The output signal is then synthesized onto the output signal from the carrier amplifier. Therefore, the Doherty amplifier can produce a higher saturation power.

In order to detect failure in the Doherty type amplifier unit in real time, it is being carried out to monitor changes in the total gain of the amplifier unit.

FIGS. 1A and 1B illustrate electrical characteristics of a Doherty amplifier composed of a carrier and a peak amplifier. Specifically, FIG. 1A illustrates an input-output characteristic and a gain characteristic when the Doherty amplifier is normally operating; and FIG. 1B illustrates the input-output characteristic and the gain characteristic when failure occurs in the carrier amplifier. It can be easily understood by comparing FIGS. 1A and 1B that gain is reduced significantly (by more than about 20 dB) when failure occurs in the carrier amplifier. Therefore, it is possible to detect failure in the carrier amplifier by monitoring changes in gain.

However, failure may occur in such an amplifier unit that cannot be detected by monitoring gain changes, as follows.

FIGS. 2A through 2C illustrate the input-output characteristics and the gain characteristics of the Doherty amplifier when failure occurs in the peak amplifier. Specifically, FIG. 2A illustrates the input-output and the gain characteristic when a partial failure occurs in the peak amplifier where a gate resistance of a Metal Oxide Semiconductor (MOS) transistor therein is reduced to about 39.4 Ohms; FIG. 2B illustrates the input-output and the gain characteristic when another partial failure occurs in the peak amplifier where the gate resistance of an MOS transistor therein is reduced to about 13.9 Ohms; and FIG. 2C illustrates the input-output and the gain characteristic when insulation breakdown occurs in the peak amplifier where the gate resistance is reduced to as low as about 0.8 Ohms.

As seen from FIGS. 2A through 2C, no significant reductions in gain are observed when failure occurs in the peak amplifier that operates below rated output, which makes it almost impossible to detect failure in the peak amplifier only by monitoring gain changes. Therefore, there is required other means for detecting failure in the Doherty amplifier, especially, in the peak amplifier thereof.

Although lots of prior art documents including patent-related documents listed below about the Doherty amplifier are available, there are only some that disclose measures against failure for the purpose of higher reliability in commercial use. As one of the examples, patent-related document 2 discloses a Doherty amplifier having a control circuit. When one of the carrier and the peak amplifier in the Doherty amplifier fails, the control circuit detects presence or absence of output signals from the carrier and the peak amplifier and accordingly controls a bias voltage of either one of the amplifiers that is outputting a signal, in order to reduce non-linear distortion of the output signal.

The patent-related document 2 discloses, in other words, a failed-amplifier identification circuit that detects presence or absence of output signals from the carrier and the peak amplifier so as to determine the amplifier outputting no signals as a failed amplifier. In such a circuit, signal levels outputted from the amplifiers are compared with a predetermined threshold level in order to determine which amplifier fails. Therefore, the control circuit has to be composed of increased numbers of circuit elements or components, which may cause false detections due to variations in electrical properties of those elements or the like. Therefore, a circuit configured simply with fewer circuit elements or components has long been desired in order to detect failure in a transistor device of the amplifier.

[Patent-related document 1] Japanese Patent Application Laid-Open Publication No. H9-181533

[Patent-related document 2] Japanese Patent Application Laid-Open Publication No. 2006-60301

When the carrier amplifier fails in the Doherty type amplifier unit, a significant reduction in gain is observed, which makes it possible to detect the failure by detecting reductions in gain or output power. However, it is difficult to detect failure by detecting reductions in gain or output power when the peak amplifier fails since such failure causes only slight reduction in gain. This is because the peak amplifier biased for Class B or C operation produces lower gain in normal operation, whereas the carrier amplifier biased for Class A or AB operation produces higher gain.

The present invention provides an amplifier unit and a method for detecting failure, which can certainly detect failure that may occur in the peak amplifier, using a simplified configuration. Furthermore, the present invention also provides an amplifier unit and a method for detecting failure, which can detect failure that may occur in other portions in the amplifier unit.

SUMMARY OF THE INVENTION

An embodiment of the present invention provides an amplifier unit including a carrier amplifier biased for Class A or Class AB operation; a peak amplifier biased for Class B or Class C operation, wherein an input signal is input to the carrier amplifier portion and the peak amplifier portion, and wherein output signals from the carrier amplifier and the peak amplifier are synthesized to be output therefrom; a comparator configured to compare a gate bias voltage of a transistor device in the peak amplifier with a predetermined threshold voltage and output a first output signal; and a failure detection circuit configured to output a second output signal indicating presence or absence of failure, based on the first output signal received from the comparator portion.

Another embodiment of the present invention provides the amplifier unit of the above embodiment, which includes a gain detection circuit configured to detect a total gain of an amplifier portion including at least the carrier amplifier portion, where the failure detection circuit receives a third output signal from the gain detection circuit and outputs a fourth output signal indicating presence of failure, based on the first output signal from the comparator and the third output signal from the gain detection circuit.

Still another embodiment of the present invention provides a method of detecting failure in an amplifier unit having a carrier amplifier biased for Class A or Class AB operation and a peak amplifier biased for Class B or Class C operation, wherein an input signal is input to the carrier amplifier portion and the peak amplifier portion, and wherein output signals from the carrier amplifier and the peak amplifier are synthesized to be output therefrom, the method including comparing a gate bias voltage of a transistor device in the peak amplifier with a predetermined threshold voltage to output a first signal; and outputting a second signal indicating presence or absence of failure, based on the first signal.

According to an embodiment of the present invention, failure in the peak amplifier can be reliably detected by using a simplified circuit including a comparator that compares the gate voltage extracted from the gate bias circuit of the transistor device therein with a predetermined threshold voltage (defect detection voltage set value). Additionally, since changes in gain of the Doherty type amplifier unit are monitored, it is possible to reliably detect failure in the Doherty type amplifier unit as a whole by synthesizing the output signal from the comparator and the output signal obtained through gain monitoring, without relying on complicated circuits.

DETAILED DESCRIPTION OF THE PREFERRED EMBODIMENT

Referring to the accompanying drawings, embodiments according to the present invention will be described hereinafter.

Figure 1A:
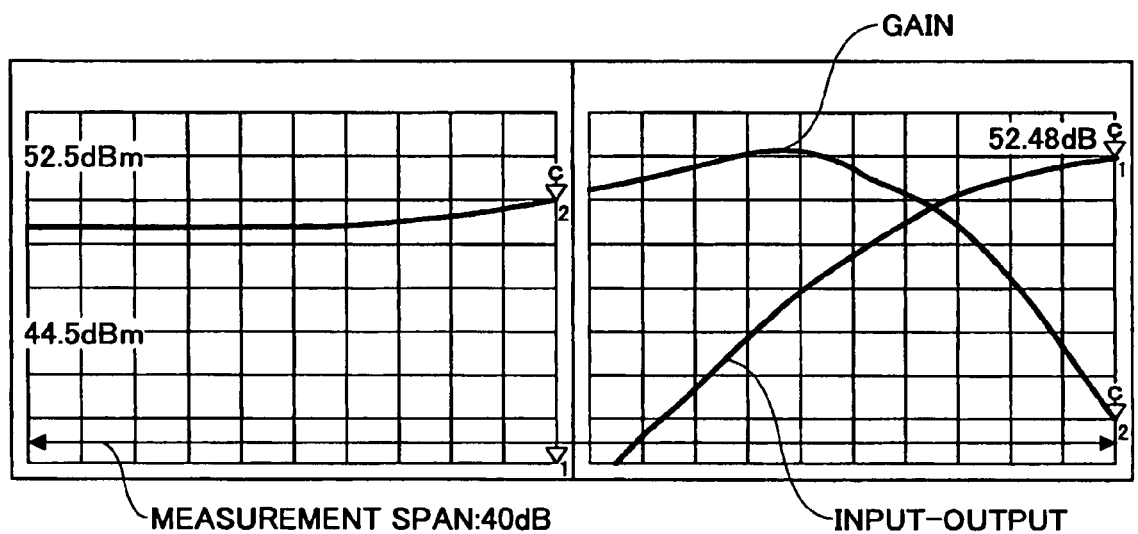
FIG. 1A illustrates electrical characteristics of a Doherty type amplifier composed of a carrier and a peak amplifier, when the carrier amplifier is normally operating.
Figure 1B:
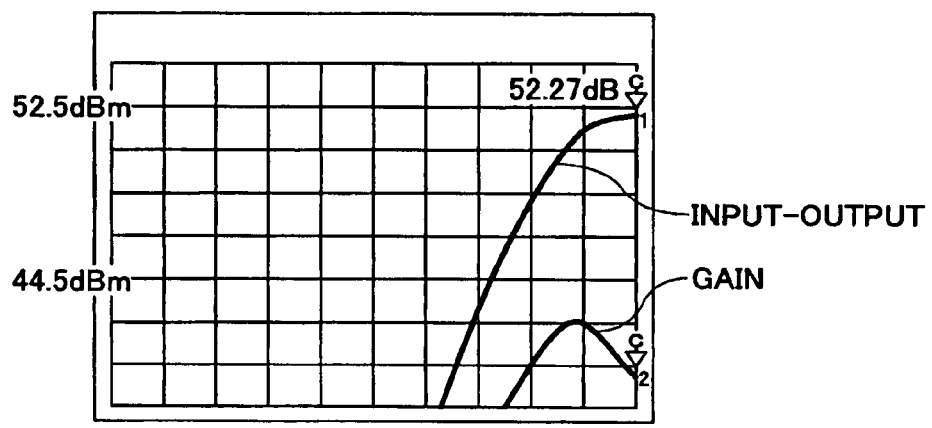
FIG. 1B illustrates electrical characteristics of a Doherty type amplifier composed of a carrier and a peak amplifier, when failure occurs in the carrier amplifier.
Figure 2A:
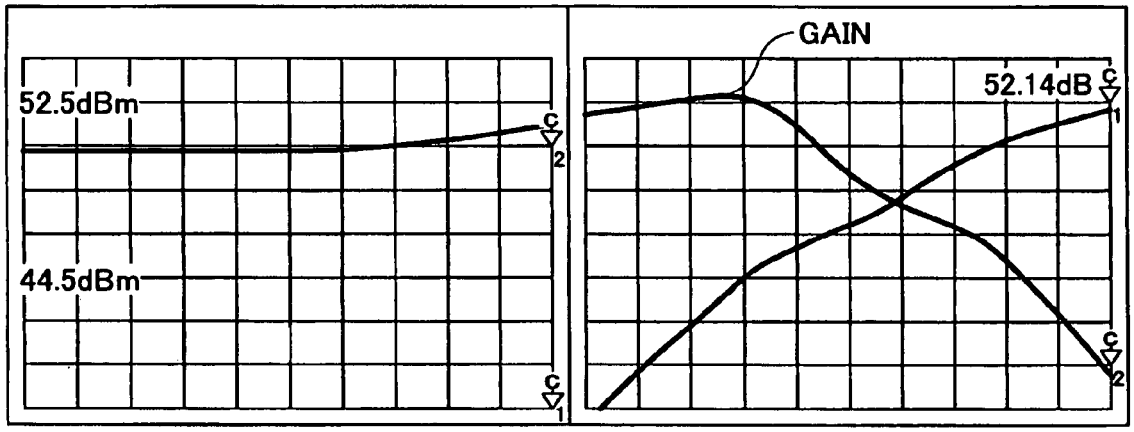
FIGS. 2A through 2C illustrate input-output and gain characteristics when failure occurs in the peak amplifier.
Figure 2B:
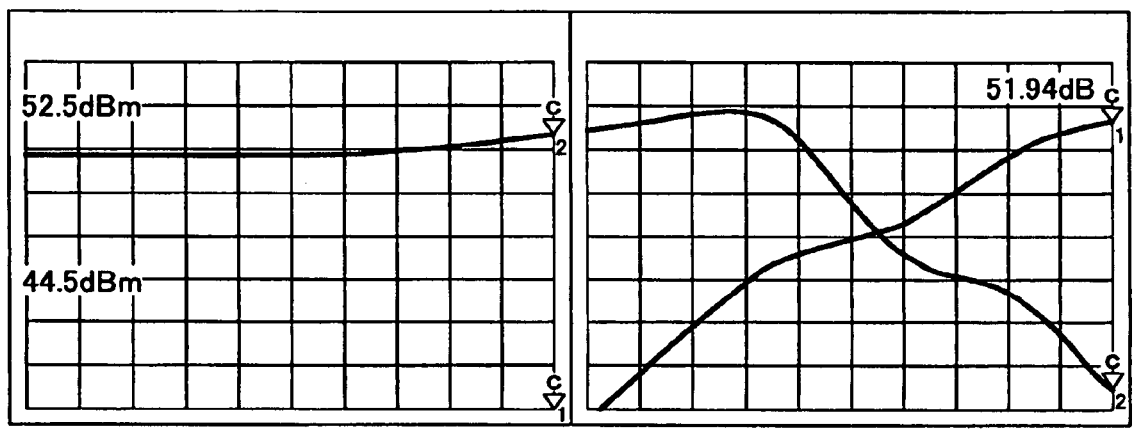
Figure 2C:
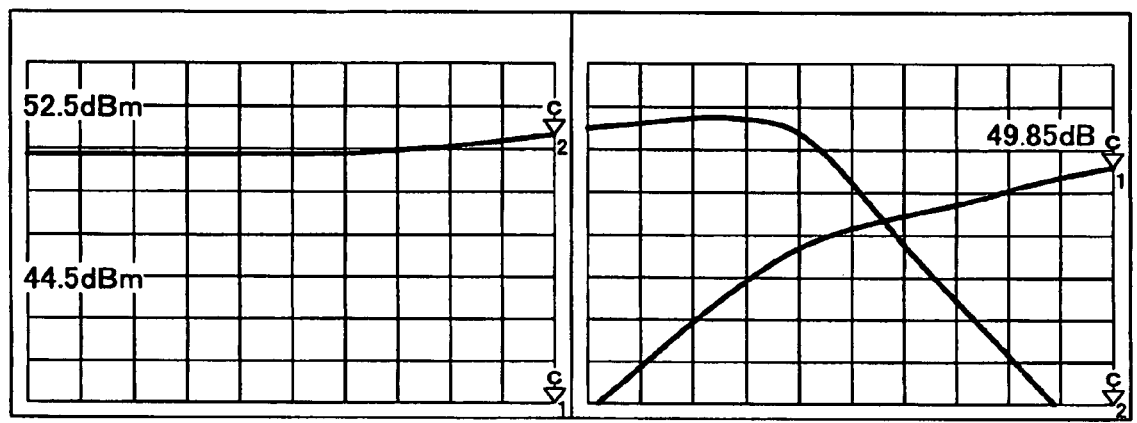
Figure 3:
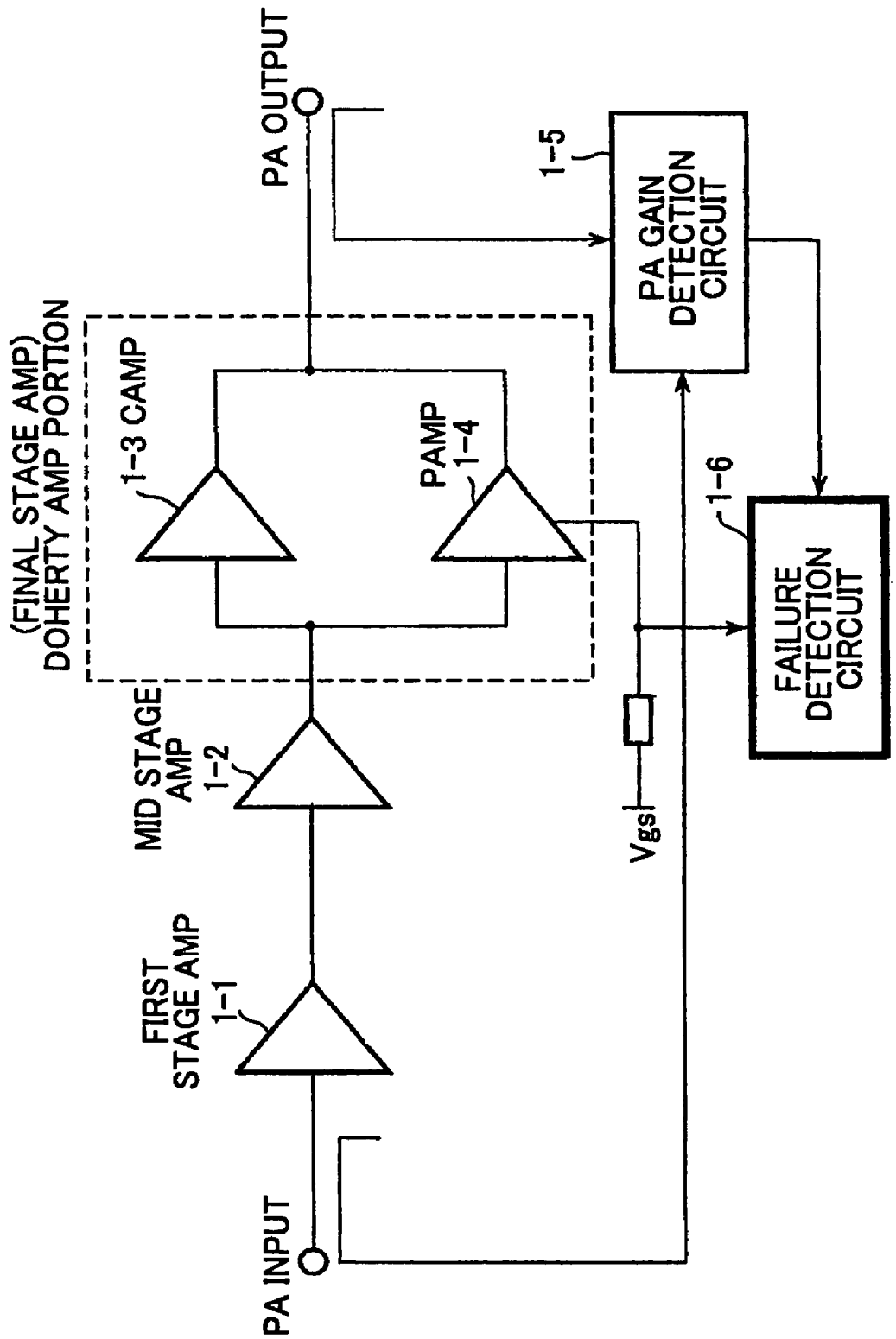
FIG. 3 is a schematic diagram of an amplifier unit according to a non-limiting embodiment of the present invention.

FIG. 3 outlines an amplifier unit according to a non-limiting embodiment of the present invention, showing specifically a failure detection circuit thereof. As shown, the amplifier unit includes a first stage amplifier 1-1, a middle stage amplifier 1-2, and a final stage amplifier as a Doherty amplifier portion composed of a carrier amplifier 1-3 and a peak amplifier 1-4. This configuration may be referred to as a power amplifier (PA) in the following description. Additionally, the amplifier unit also includes a PA gain detection circuit 1-5 and a failure detection circuit 1-6.

When failure occurs, for example, in the first stage amplifier 1-1, the middle stage amplifier 1-2, or the carrier amplifier 1-3, a total gain thereof is reduced significantly. Therefore, the failure can be identified as follows. First, an input signal to and an output signal from the power amplifier (PA) are respectively branched by a branch circuit (not shown) and sent into the PA gain detection circuit. Next, the difference between the input and the output signal is obtained and compared with a predetermined threshold voltage in the PA gain detection circuit. Then, the PA gain detection circuit detects the failure when the difference exceeds the threshold voltage.

However, since no significant change in gain is observed in the case of failure in the peak amplifier 1-4, as described above, it is extremely difficult to configure a detection circuit having sufficient sensitivity to detect such a minute change in gain. In this embodiment of the present invention, a gate bias voltage of the peak amplifier 1-4 is branched into the failure detection circuit 1-6, which then compares the gate bias voltage with a predetermined reference voltage so as to determine that the peak amplifier 1-4 has failed when the gate bias voltage is lower than the reference voltage.

As stated above, the PA gain detection circuit 1-5 functions to detect failure based on gain changes and the failure detection circuit 1-6 functions to detect failure in the peak amplifier 1-4. Therefore, according to the present embodiment, failure that may occur throughout in the power amplifier (PA) can be detected.

Figure 4:
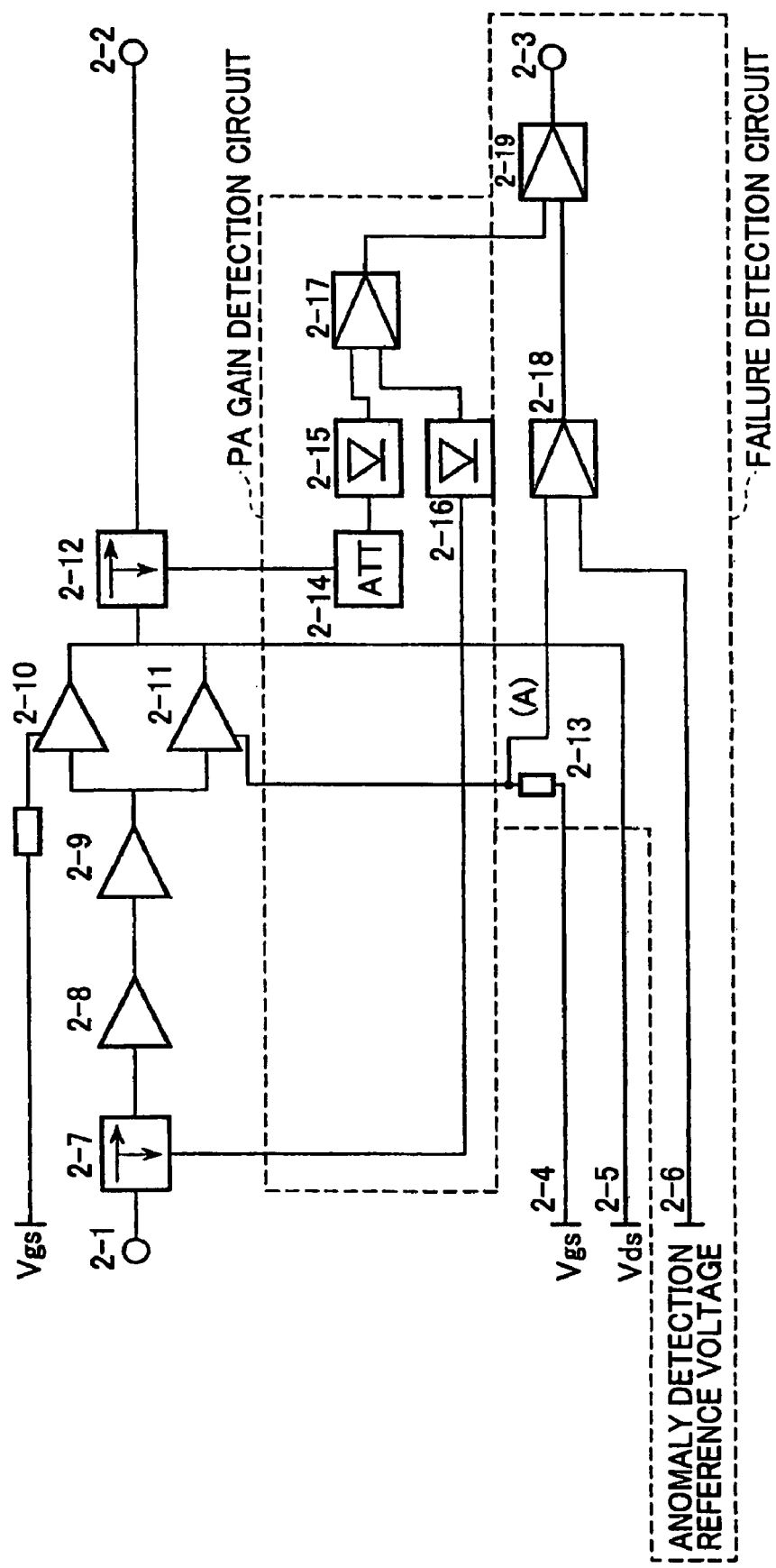
FIG. 4 is a detailed circuit diagram of the amplifier unit shown in FIG. 3.

FIG. 4 illustrates a detailed circuit diagram of the amplifier unit shown in FIG. 3 according to an embodiment the present invention. As shown, an input signal at a radio frequency input from an input terminal 2-1 is branched by a directional coupler 2-7 into a first stage amplifier 2-8 and a power detection circuit 2-16.

The branched signal that is sent to the first stage amplifier 2-8 is amplified thereby and then amplified again by a middle stage amplifier 2-9 to be further branched to a carrier amplifier 2-10 and a peak amplifier 2-11 that constitute elements of a final stage amplifier as a Doherty amplifier. After being further amplified by the final stage amplifier, the signal is divided by a directional coupler 2-12 and sent to an output terminal 2-2 and an attenuator 2-14.

In the PA gain detection circuit, the other branched signal branched by the directional coupler 2-7 is detected by the power detection circuit 2-16 in which a DC voltage component therefrom is produced. Additionally, in the PA gain detection circuit, the signal extracted by the directional coupler 2-12 is attenuated by the attenuator 2-14 and the attenuated signal is detected by a power detection circuit 2-15 in which a DC voltage component therefrom is produced. By the way, the attenuator 2-14 is disposed in a signal line between the power detection circuit 2-15 and the directional coupler 2-12 in order to match levels of the respective incoming signals to the power detection circuits 2-15, 2-16.

The above two DC voltage components are compared by a comparator 2-17. When the power amplifier (PA) achieves the rated gain, the comparator 2-17 outputs a predetermined voltage X. When the gain achieved by the power amplifier (PA) is lower than the rated gain, the comparator outputs a voltage X−α lower than the voltage X. When the gain achieved by the power amplifier (PA) is higher than the rated gain, the comparator outputs a voltage X+α higher than the voltage X.

As bias voltages supplied to the peak amplifier 2-11, a gate bias voltage (Vgs) 2-4 and a drain bias voltage (Vds) 2-5 are applied to an MOS transistor of the peak amplifier 2-11. By the way, the gate bias voltage (Vgs) 2-4 is applied thereto through a gate bias resistor 2-13 that enhances impedance in a gate bias circuit to prevent oscillation.

The gate bias voltage is extracted at a point A in FIG. 4 from the gate bias circuit and compared with an anomaly detection reference voltage 2-6 by a comparator 2-18. When the peak amplifier 2-11 operates normally, the comparator 2-18 outputs a low level voltage Lo. When the gate resistance is reduced due to insulation breakdown that may occur in the gate electrode of the MOS transistor of the peak amplifier 2-11, the gate bias voltage extracted from the gate bias circuit is reduced, which causes the comparator 2-18 to output a high level voltage Hi.

Next, a PA gain detection voltage (i.e., X, X−α, or X+α) from the comparator 2-17 of the PA gain detection circuit and the output voltage (i.e., Lo or Hi) from the comparator 2-18 of the failure detection circuit are added by an adder 2-19, which then outputs the resulting voltage as a warning signal 2-3 indicating failure in the power amplifier (PA).

According to the above configuration, when failure occurs in the power amplifier (PA) that affects the gain thereof, the failure can be identified by the output voltage from the comparator 2-17 of the PA gain detection circuit; and when failure occurs in the peak amplifier 2-11, the failure can be identified by the output voltage of the comparator 2-18 of the failure detection circuit. In either case, the warning signal 2-3 indicating failure in the power amplifier (PA) is output.

Therefore, even if it is generally difficult to detect through changes in gain a failure in the peak amplifier 2-11 of the Doherty type amplifier unit, the above amplifier unit according to this embodiment can successfully detect such a failure, in addition to the failure in the other portions of the power amplifier (PA).

Figure 5:
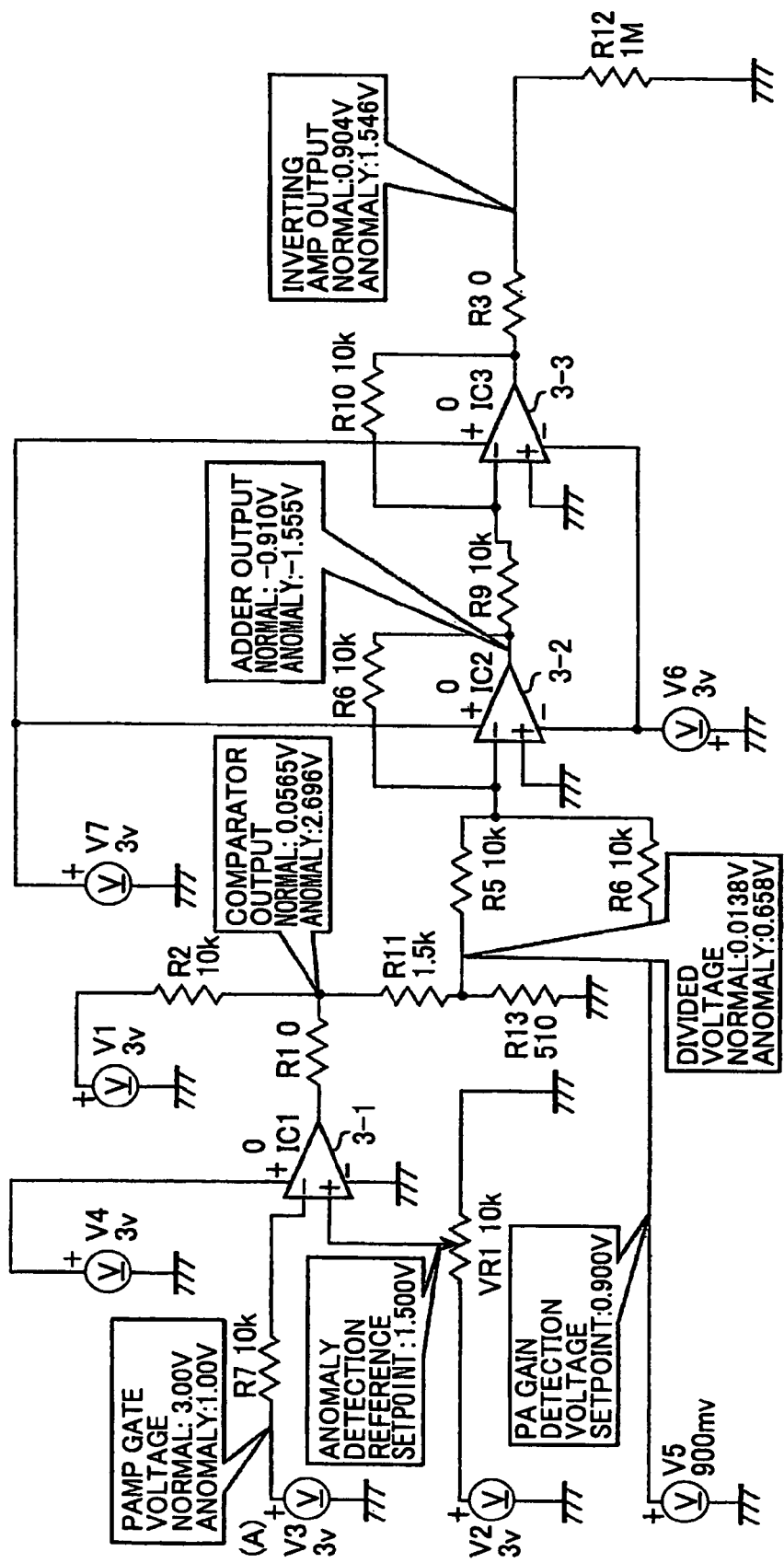
FIG. 5 is a circuit diagram of the amplifier unit according to an embodiment of the present invention, which is used for simulation analysis.

Next, failure detection results obtained from simulation analysis will be described with reference to FIGS. 5, 6A, and 6B. FIG. 5 is a circuit diagram used for the purpose of the analysis, specifically illustrating the PA gain detection circuit and the failure detection circuit of the amplifier unit according to the embodiment. In FIG. 5, a voltage at a point (A) corresponds to the gate bias voltage at the point A of the peak amplifier 2-11 in FIG. 4 and is assumed here to be at 3.00 volts at the time of normal operation and at 1.0 volt at the time of failure. An operational amplifier 3-1 in FIG. 5 corresponds to the comparator 2-18 in FIG. 4. The gate bias voltage at the point (A) and the anomaly detection reference voltage set at 1.50 volts by a variable resistor VR1 are input to the operational amplifier 3-1.

Then, the operational amplifier 3-1 (comparator 2-18) outputs 0.0565 volts at the time of normal operation and 2.696 volts at the time of failure. These output voltages are divided respectively to 0.0138 volts and 0.658 volts, and input to an adder that is composed of operational amplifiers 3-2, 3-3. This adder corresponds to the adder 2-19 in FIG. 4 and thus outputs the warning signal (i.e., 2-3).

To the adder composed of the operational amplifiers 3-2, 3-3 is also input a voltage of 0.90 volts predetermined as the PA gain detection voltage in this simulation. Then, the adder adds up the voltage obtained by dividing the output voltage from the operational amplifier 3-1 (comparator 2-18) and the PA gain detection voltage of 0.9 volts. At this time, the operational amplifier 3-2 outputs voltages which are −0.910 volts at the time of normal operation and −1.555 volts at the time of failure. These voltages are inverted by the operational amplifier 3-3 and then output. These output voltages are 0.904 volts at the time of normal operation and 1.546 volts at the time of failure.

Figure 6A:
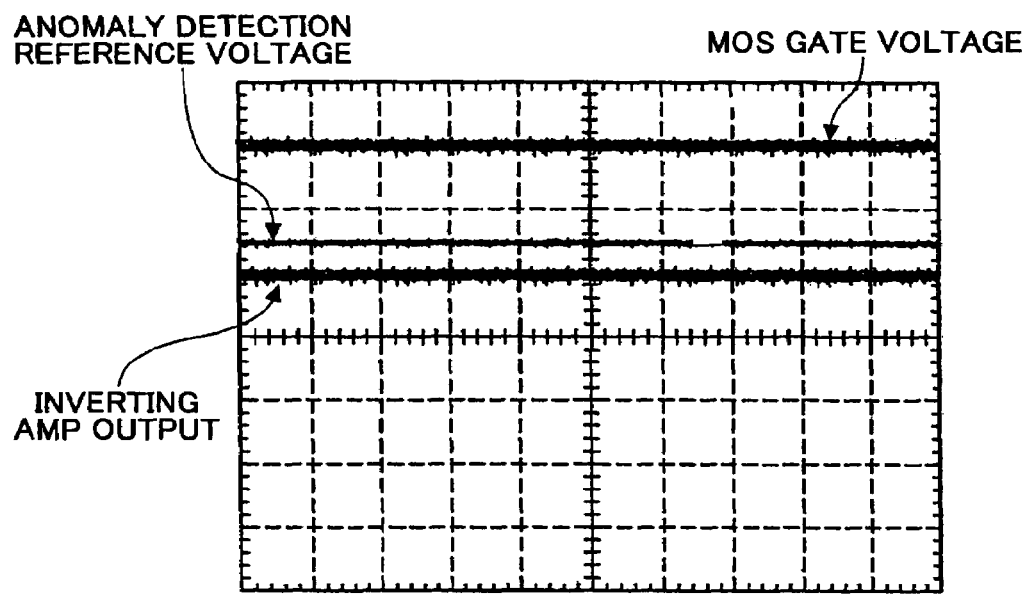
FIG. 6A illustrates gate voltages in the peak amplifier, failure detection voltages, and inverted output voltages in the amplifier unit shown in FIG. 5, when the amplifier unit is under normal operation.
Figure 6B:
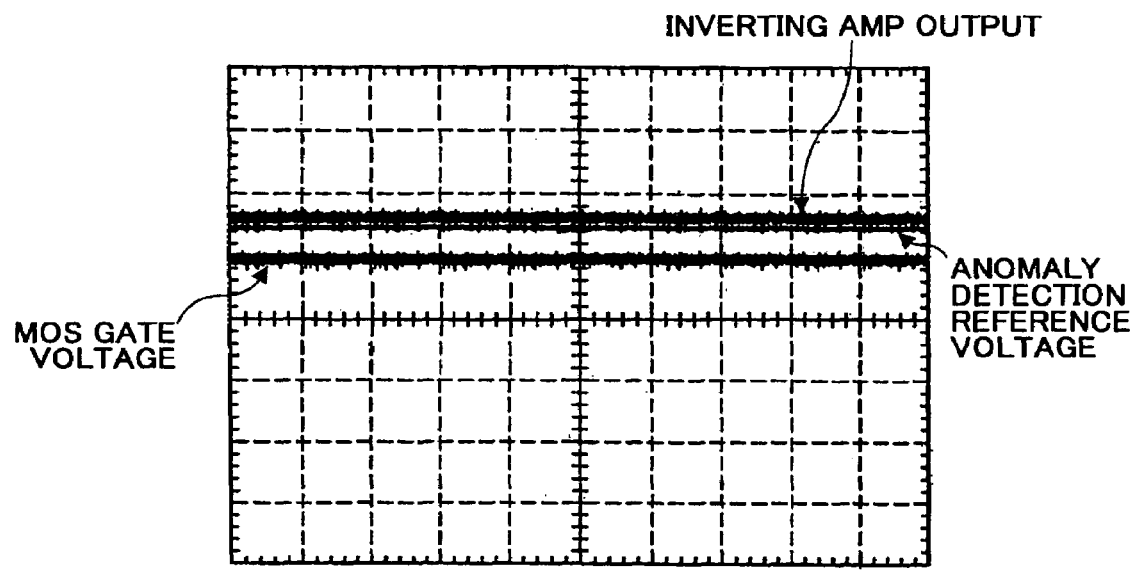
FIG. 6B illustrates gate voltages in the peak amplifier, failure detection voltages, and inverted output voltages in the amplifier unit shown in FIG. 5, when failure occurs in the amplifier unit during operation.

FIGS. 6A and 6B illustrate measurement results of the gate voltages of the MOS transistor in the peak amplifier of the amplifier unit shown in FIG. 5, the anomaly detection reference voltage input into the operational amplifier 3-1, and the inverted output voltages output from the operational amplifier 3-3. Specifically, FIG. 6A illustrates these voltages when the amplifier unit is under normal operation, where the gate bias voltage of the MOS transistor in the peak amplifier, which corresponds to the peak amplifier 2-11 in FIG. 4, is 3.0 volts. FIG. 6B illustrates the voltages when failure occurs in the amplifier unit, where the gate bias voltage of the MOS transistor in the peak amplifier (i.e., 2-11) is 1.0 volt.

As shown in FIGS. 6A and 6B, it has been found that the adder actually outputs the voltages as described above, depending on presence or absence of failure in the peak amplifier, and thus the PA gain detection circuit and the failure detection circuit can operate appropriately in the amplifier unit as configured above.

By the way, the inventors of the present invention have affirmed, the circuit shown in FIG. 5 as a simulation model, that failure can be detected in a Doherty type amplifier unit with a laterally diffused MOS (LDMOS) transistor.

The amplifier unit and the method for detecting failure in the same according to the embodiment of the present invention is effectively applicable for failure detection in a transmission amplifier apparatus using the Doherty type amplifier unit in a base station of mobile communications system for the purpose of improving power efficiency.

The present application is based on Japanese Priority Application No. 2006-128271 filed on May 2, 2006, with the Japanese Patent Office, the entire contents of which are hereby incorporated by reference.

What is claimed is:

1. An amplifier unit comprising:
    a carrier amplifier biased for Class A or Class AB operation;
    a peak amplifier biased for Class B or Class C operation, wherein an input signal is input to the carrier amplifier and the peak amplifier, and wherein output signals from the carrier amplifier and the peak amplifier are joined to be output therefrom;
    a comparator configured to compare a gate bias voltage of a transistor device in the peak amplifier with a predetermined threshold voltage and output a first output signal; and
    a failure detection circuit configured to output a second output signal indicating presence or absence of failure, based on the first output signal received from the comparator portion.

2. The amplifier unit of claim 1, further comprising a gain detection circuit configured to detect a total gain of an amplifier portion of the amplifier unit, the amplifier portion including at least the carrier amplifier,
    wherein the failure detection circuit receives a third output signal from the gain detection circuit and outputs the second output signal indicating presence or absence of failure, based on the first output signal from the comparator and the third output signal from the gain detection circuit.

3. A method of detecting failure in an amplifier unit having a carrier amplifier biased for Class A or Class AB operation and a peak amplifier biased for Class B or Class C operation, wherein an input signal is input to the carrier amplifier and the peak amplifier portion, and wherein output signals from the carrier amplifier and the peak amplifier are joined to be output therefrom, the method comprising:
- comparing a gate bias voltage of a transistor device in the peak amplifier with a predetermined threshold voltage to output a first signal; and
- outputting a second signal indicating presence or absence of failure, based on the first signal.

4. An amplifier apparatus suitable for a base station in a mobile communications system, the amplifier apparatus comprising at least the amplifier unit of claim 1.

* * * * *